United States Patent
Jo et al.

[11] Patent Number: 5,867,011
[45] Date of Patent: Feb. 2, 1999

[54] MAXIMUM POWER POINT DETECTING CIRCUIT

[75] Inventors: Hyun-Min Jo, Pucheon; Yong-Ho Kim, Seoul, both of Rep. of Korea

[73] Assignee: Samsung Electronics, Co., Ltd., Suwon, Rep. of Korea

[21] Appl. No.: 839,865

[22] Filed: Apr. 22, 1997

[30]     Foreign Application Priority Data

May 15, 1996 [KR] Rep. of Korea ............... 1996-16307

[51] Int. Cl.⁶ .................................................. G05F 5/00
[52] U.S. Cl. ............................................................ 323/299
[58] Field of Search ..................................... 323/299, 301, 323/303, 906

[56]            References Cited

U.S. PATENT DOCUMENTS

| | | | |
|---|---|---|---|
| 4,580,090 | 4/1986 | Bailey et al. | 323/303 |
| 4,649,334 | 3/1987 | Nakajima | 232/299 |
| 4,873,480 | 10/1989 | Lafferty | 323/229 |
| 4,916,382 | 4/1990 | Kent | 323/299 |
| 5,268,832 | 12/1993 | Kandatsu | 363/95 |
| 5,327,071 | 7/1994 | Frederick et al. | 363/299 |
| 5,682,305 | 10/1997 | Kurokami et al. | 363/79 |

*Primary Examiner*—Matthew V. Nguyen
*Attorney, Agent, or Firm*—Marger, Johnson, McCollom P.C.

[57]            ABSTRACT

A maximum power point detecting circuit is disclosed including: a power detector for generating a power detecting signal responsive to an output voltage and an output current of a solar cell; a comparator for comparing a previous power average value with a current power average value according to the power detecting signal for a constant time; and a discriminator for latching an output signal of the comparing means immediately after a current constant time, setting an output immediately before a previous constant time, and judging that an output power of the solar cell decreases when the current power average value is smaller than the previous power average value to generate a discriminating signal.

6 Claims, 4 Drawing Sheets

:5,867,011

MAXIMUM POWER POINT DETECTING CIRCUIT

FIELD OF THE INVENTION

The present invention relates to maximum power point detecting circuits, and more particularly to a maximum power point detecting circuit which is capable of detecting a maximum power point varying according to the strength of a solar light incident upon a solar cell and to an ambient temperature.

BACKGROUND OF THE INVENTION

In one aspect of utilizing solar energy, a solar cell is used to convert solar energy into electric energy. The power of the solar cell differs according to the strength of a solar light incident upon the solar cell and to an ambient temperature, as indicated in FIGS. 1 and 2. These variations in the power bring about a change in an output impedance of the solar cell. If a fixed load is driven by the solar cell, impedance mismatching occurs and the efficiency of the power transfer to the load is lowered. Hence, efforts have been made to maximize the power transfer efficiency.

In U.S. Pat. No. 4,873,480, incorporated herein by reference, a cell array and an independent cell are installed in a solar cell panel, as shown in FIG. 3. A reference voltage is generated through the independent cell, and a pulse width modulation signal is generated by comparing the reference voltage with an output voltage of the cell array. The power supplied to a load is switched in response to pulse width modulation signal. Therefore, the output voltage of the solar cell is maintained at a constant voltage level irrespective of the strength of the solar light or the ambient temperature.

However, a technique such as that disclosed in the above U.S. Pat. No. 4,873,480 causes slight variations in the output voltage in order to obtain the maximum power point for the level of solar light, as indicated in FIG. 1. Although the efficiency is better than when a constant reference voltage is used, it is difficult to transfer the maximum power at every condition, and an additional independent cell should be provided.

To compensate for variations in the output voltage of a solar cell due to ambient temperature fluctuations, U.S. Pat. No. 4,580,090, incorporated herein by reference, utilizes a thermistor for detecting the output voltage of the solar cell and compensating the detected voltage for temperature, as shown in FIG. 4. However, the output voltage of the solar cell is detected by dividing the voltage through resistors, and the temperature is compensated by using the thermistor connected in series with these resistors. Therefore, if the solar light is very weak, the overall efficiency is lowered.

In U.S. Pat. No. 4,916,382, incorporated herein by reference, the output voltage and current of the solar cell are converted to digital data through an analog-to-digital converter, as shown in FIG. 5. The digital data obtained is processed by a controller to calculate and store the maximum power point. However, such a technique requires complicated circuitry due to the input power measurement interface circuit needed for the controller, which raises the cost.

SUMMARY OF THE INVENTION

It is therefore an object of the present invention to provide a maximum power point detecting circuit which is capable of following a maximum power point irrespective of the strength of a solar light and an ambient temperature.

It is another object of the present invention to provide a maximum power point detecting circuit having a relatively simple circuit construction.

A maximum power point detecting circuit embodying the present invention includes: a power detector for generating a power detecting signal responsive to an output voltage and an output current of a solar cell; a comparator for comparing a previous average power value with a current average power value according to the power detecting signal for a constant time interval; and a discriminator for latching an output signal of the comparator immediately after a current constant time interval, setting an output immediately before a previous constant time interval, and determining whether output power of the solar cell decreases when the current average power value is smaller than the previous average power value in order to generate a discriminating signal.

DETAILED DESCRIPTION OF PREFERRED EMBODIMENT

Figure 1:
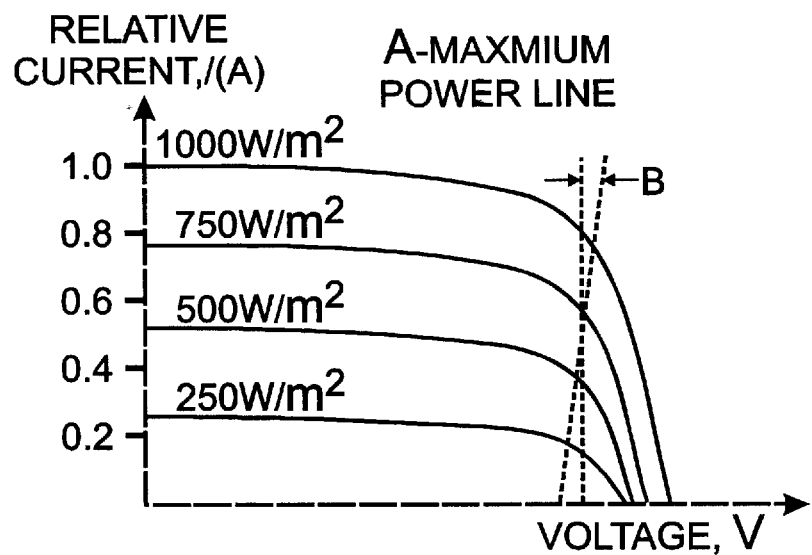
FIG. 1 is a graph showing output voltage and current characteristics relative to the strength of a solar light incident upon a solar cell.
Figure 2:
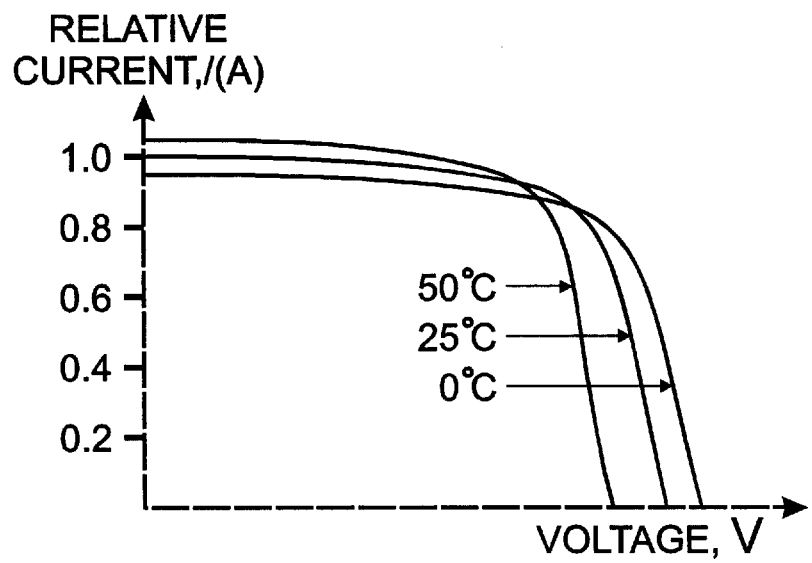
FIG. 2 is a graph showing output voltage and current characteristics relative to an ambient temperature of a solar cell.
Figure 3:
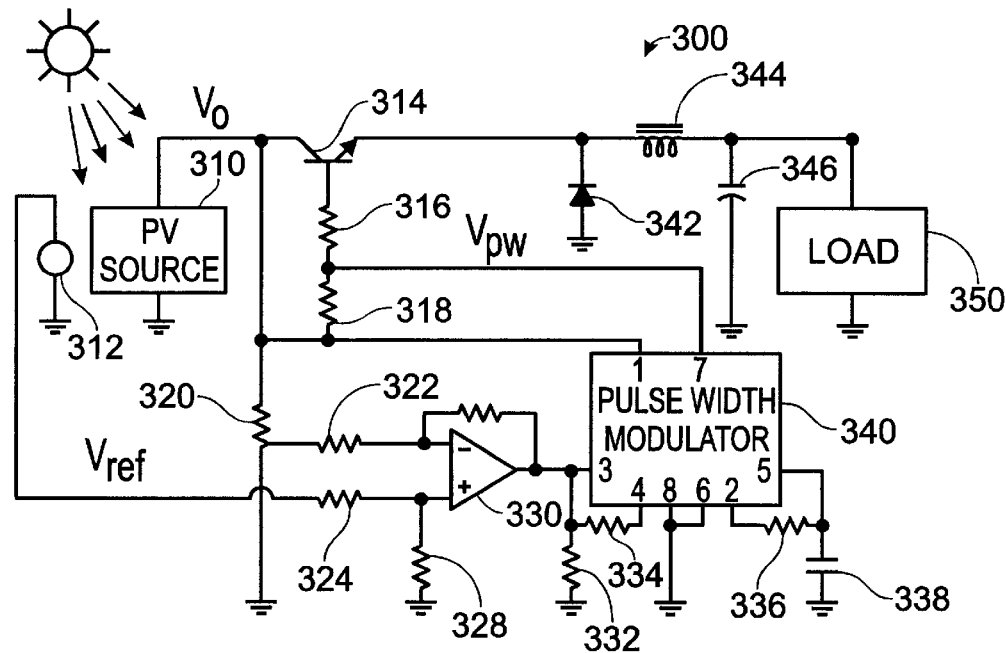
FIG. 3 is a block diagram of a conventional maximum power follow-up apparatus.
Figure 4:
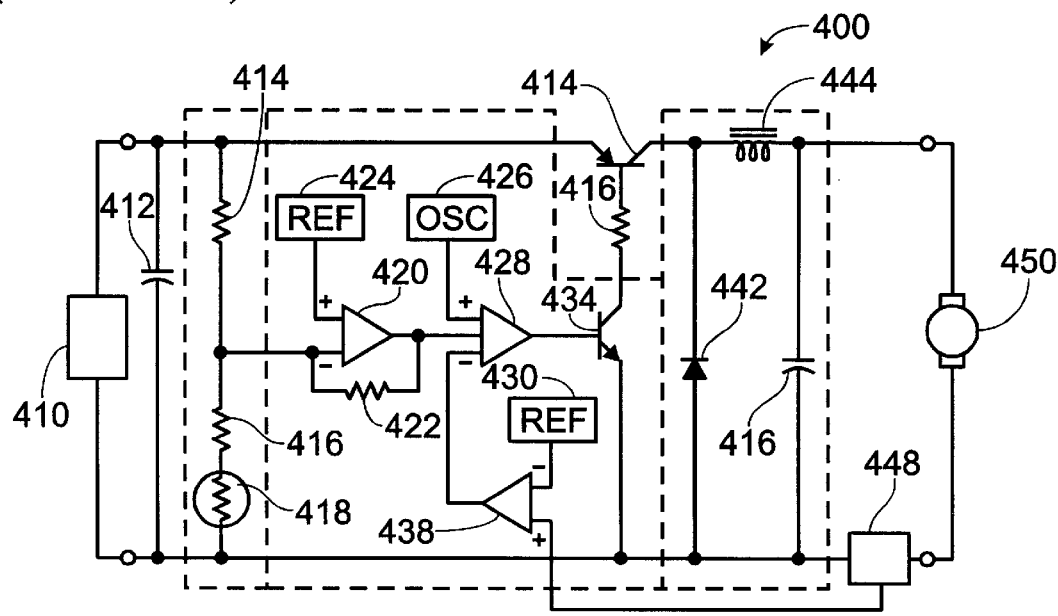
FIG. 4 is a block diagram of a conventional system for maximizing the efficiency of power transmission that includes termperature compensation.
Figure 5:
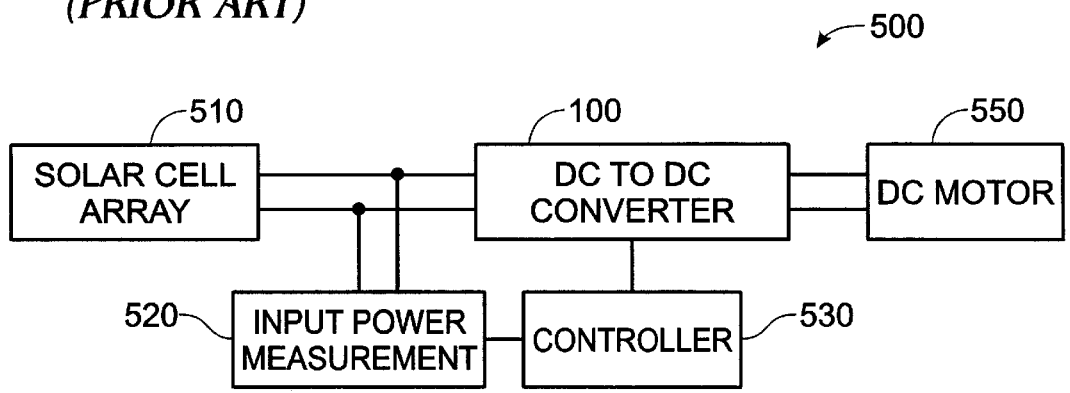
FIG. 5 is a block diagram of a prior art solar energy system to which a variable impedance matching circuit is combined to improve the conversion efficiency of a photo-electric cell power source.
Figure 6:
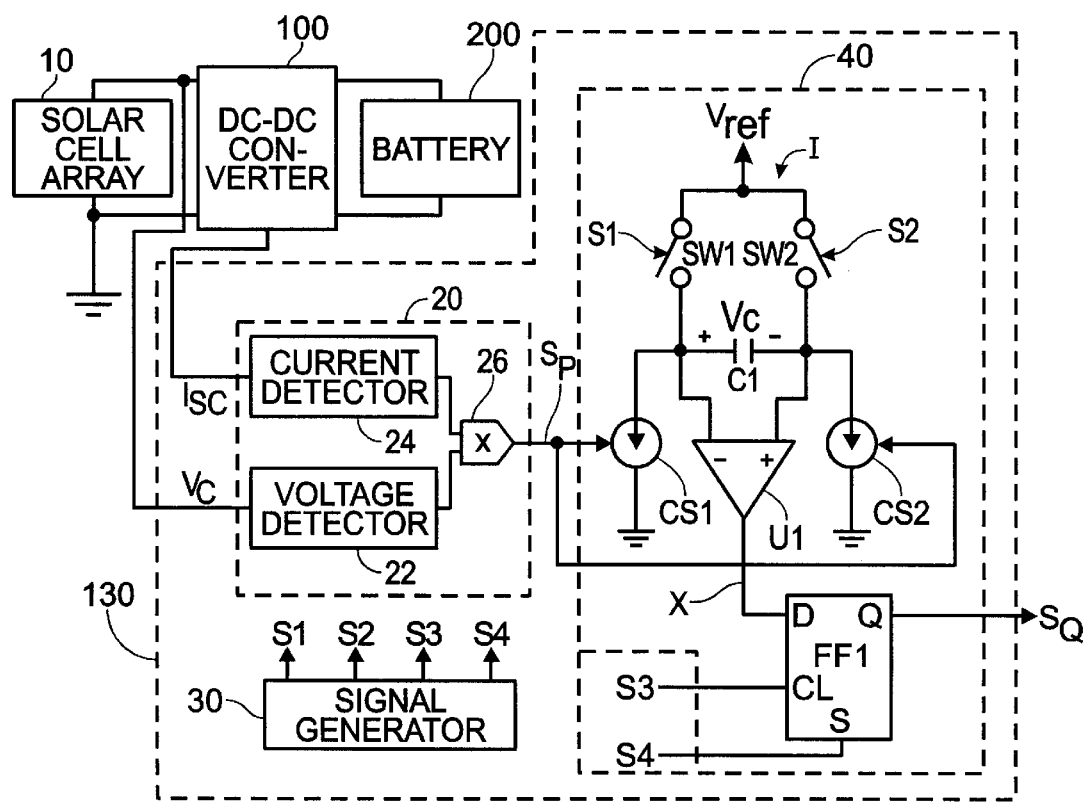
FIG. 6 is a circuit diagram of a maximum power point detecting circuit according to the present invention.

Referring to FIG. 6, a maximum power point detecting circuit includes a power detector 20 for generating a power detecting signal responsive to an output voltage and an output current of a solar cell or a solar cell array 10, a signal generator 30 for generating sampling signals S1–S4, and a maximum power point discriminator 40. The maximum power point discriminator 40 compares a previous quantity of charge with a current quantity of charge according to the power detecting signal for a given sampling period in response to the sampling signals. If the previous quantity of charge is greater than the current quantity of charge, the maximum power point discriminator 40 determines that the output power of the solar cell 10 has decreased, and generates a discriminating signal. Reference numerals 100 and 200 indicate a DC-DC converter and a battery load, respectively.

The power detector 20 has a voltage detector 22 for generating a voltage detecting signal by detecting the output voltage of the solar cell 10, a current detector 24 for generating a current detecting signal by detecting the output current of the solar cell 10, and a multiplier 26 for generating the power detecting signal by multiplying the voltage detecting signal by the current detecting signal.

The sampling output of the signal generator 30 includes a first switching signal S1, a second switching signal S2, a clock signal S3, and a set signal S4. The first switching signal S1 has a "high" interval longer than a "low" interval during each given sampling period, such as T1, T2 and T3 shown in FIG. 7. The second switching signal S2 is shifted within the sampling period by the "high" interval of the first switching signal S1. The clock signal S3 has the same period as the first and second switching signals S1 and S2, but has a "high" interval during a given sampling period only during an interval in which the "high" intervals of the first and second switching signals S1 and S2 are overlapped. The set signal S4 has the same period as the first and second switching signals S1 and S2, and has a rising edge at each falling edge of the clock signal S3.

In the maximum power point discriminator 40, a first current source CS1 is connected between an inverting terminal (−) of a comparator U1 and a ground terminal, and varies its current in response to the power detecting signal generated from the power detector 20. A second current source CS2 having the same quantity of current as the first current source CS1 is connected between a noninverting terminal (+) of the comparator U1 and the ground terminal, and also varies its current in response to the power detecting signal. A capacitor C1 is connected between the inverting and noninverting terminals of the comparator U1. A first switch S1 connected between the inverting terminal (−) of the comparator U1 and a reference voltage Vref is turned on by the "high" interval of the first switching signal S1, and turned off by the "low" interval of the first switching signal S1. A second switch S2 connected between the noninverting terminal (+) of the comparator U1 and the reference voltage Vref is turned on by the "high" interval of the second switching signal S2, and turned off by the "low" interval of the second switching signal S2. A flip-flop FF1 latches the output X of the comparator U1 in response to the clock signal S3, and sets an output in response to the set signal S4.

Figure 8:
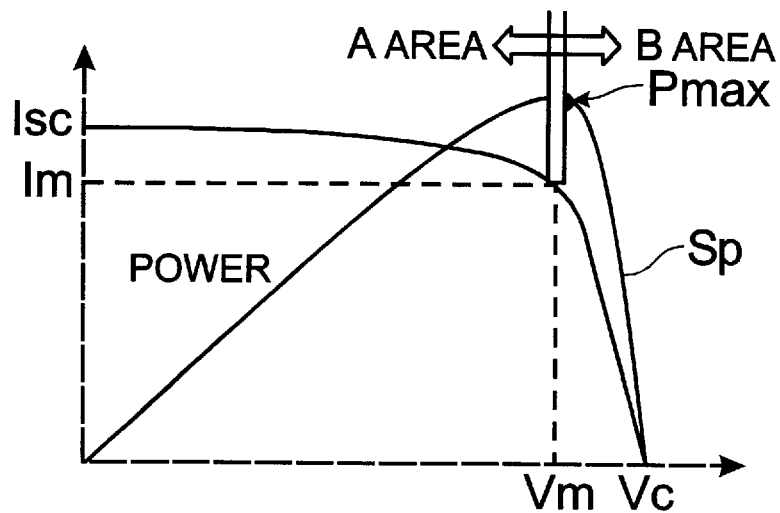
FIG. 8 is a graph showing the relationship between an output voltage, an output current and a power of a solar cell.

In operation, the power detector 20 shown in FIG. 6 generates a power detecting signal Sp having the characteristic curve shown in FIG. 8 according to the output voltage Vc and the output current Isc of the solar cell 10. That is, the power increases in an area A of the curve, and decreases in an area B of the curve. The maximum power point Pmax is obtained by the product of a voltage Vm and a current Im.

Figure 7:
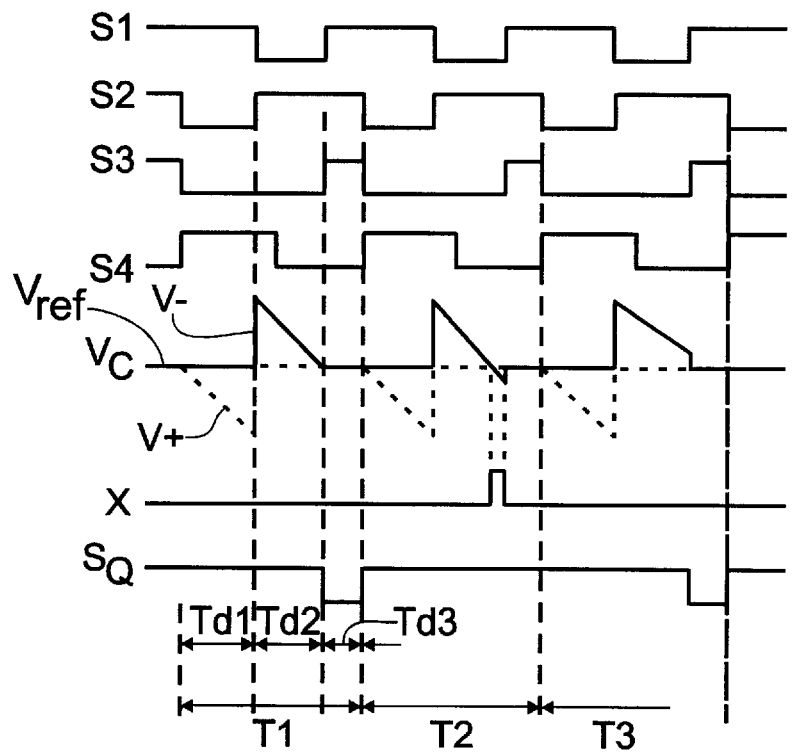
FIG. 7 is a timing chart showing a signal waveform of each portion of FIG. 6.

The power detecting signal is supplied to the maximum power point discriminator 40. Initially, since the first and second switching signals S1 and S2 are maintained at a "high" state as indicated in FIG. 7, the reference voltage Vref is supplied to the inverting and noninverting terminals of the comparator U1, and both terminals of the comparator U1 maintain at an identical potential. If both terminals of the comparator U1 are at an identical potential, the output of the comparator U1 will be at a "low" state. In this state, a voltage Vc across both terminals of the capacitor C1 is maintained at 0.

During an interval Td1 in which the second switching signal S2 is set to a "low" state and the first switching signal S1 is a "high" state, the first switch SW1 is turned on and the second switch SW2 is turned off. Initially, the current I is supplied from the reference voltage. Then the current I is divided into the current flowing through the first current source CS1 and the current flowing through the capacitor C1 and the second current source CS2. If the capacitor C1 is gradually charged and reaches a first quantity of charge, the potential of the inverting terminal (−) of the comparator U1 is maintained at the reference voltage Vref. The potential of the noninverting terminal (+) of the comparator U1 is gradually lowered to −Vc in proportion to the capacitance of the capacitor C1. During an interval Td2 in which the first switching signal S1 is set to a "low" state and the second switching signal S2 is set to a "high" state, the first switch SW1 is turned off and the second switch SW2 is turned on. The potential of the noninverting terminal (+) of the comparator U1 is raised to the reference voltage Vref, and the potential of the inverting terminal (−) of the comparator U1 is raised to Vref+Vc. The quantity of charge on the capacitor C1 drains through the first current source CS1. Since the intervals Td1 and Td2 are the same, if the power detecting signal does not change, the current source CS1 responsive to the power detecting signal during the interval Td1 draws the same quantity of current as the current source CS2 responsive to the power detecting signal during the interval Td2. Hence, the quantity of charge stored on the capacitor C1 is the same as the quantity of charge drained from capacitor C1 for a given sampling period. At the end of the interval Td2, the potential of the inverting terminal (−) of the comparator U1 is identical to the reference voltage Vref. Therefore, the output of the comparator U1 is at a "low" state. The output of the flip-flop FF1, which was set to a "high" state by the set signal S4, is set to a "low" state by latching the output of the comparator U1 at the rising edge of the clock signal S3. That is, the average power detecting signal does not vary in size during the intervals Td1 and Td2.

As shown in FIG. 7, if the power detecting signal during the interval Td2 in a period T2 is larger than that during the interval Td1, the voltage Vc across the capacitor C1 becomes negative. In other words, the potential of the inverting terminal (−) of the comparator U1 becomes lower than the reference voltage Vref. Since the potential of the noninverting terminal (+) of the comparator U1 is maintained at the reference voltage Vref, and the potential of the inverting terminal (−) is maintained at a voltage level lower than the reference voltage Vref, the output of the comparator U1 is set to a "high" state. The output of the flip-flop FF1 is maintained at a "high" state. Consequently, the output power of the solar cell 10 increases during the present sampling period (T2) relative to the previous sampling period (T1).

In contrast, if the power detecting signal during the interval Td2 in a period T3 is smaller than that during the interval Td1, the voltage Vc across the capacitor C1 rises to a voltage level higher than the reference voltage Vref. The potential of the noninverting terminal (+) of the comparator U1 is maintained at the reference voltage Vref, and the potential of the inverting terminal (−) obtains a voltage level higher than the reference voltage Vref. That is, when the voltage Vc across the capacitor C1 becomes a positive value, the output of the comparator U1 is set to a "low" state. Since the flip-flop FF1 latches the output of the comparator U1 at the rising edge of the clock signal S3, the output of the flip-flop FF1 is also set to a "low" state. Consequently, the output power of the solar cell 10 decreases during the present sampling period (T3) relative to the previous sampling period (T2).

At the end of the interval Td2, the flip-flop FF1 latches the output of the comparator U1 on the rising edge of the clock signal S3, and starts to increase the power again at the rising set signal S4. The latched signal $S_Q$ appears at the terminal Q of flip-flop FF1. The flip-flop FF1 thus prevents the system from shutting down for an entire sampling period.

As described above, since the maximum power point is determined in the present invention by comparing the average power value of the present sampling period with the average power value of the previous sampling period, wherein the sampling periods are of the same time duration, the maximum power point detecting signal is less responsive to noise or transient variations in the power during a given sampling period. Furthermore, since the maximum power point can be detected in the present invention by using relatively simple analog circuits, such as capacitors, comparators, switches, current sources, etc., the inventive circuit can be constructed at low cost.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. A maximum power point detecting circuit comprising:
   power detecting means for generating a power detecting signal responsive to an output voltage and an output current of a solar cell;
   signal generating means for generating first and second sampling signals; and
   maximum power point discriminating means for comparing a previous quantity of charge with a current quantity of charge, the previous quantity of charge being charged according to said power detecting signal in response to said first sampling signal, the current quantity of charge being charged according to said power detecting signal in response to said second sampling signal, and judging that an output power of said solar cell decreases when said previous quantity of charge is greater than said current quantity of charge to generate a discriminating signal.

2. A maximum power point detecting circuit as claimed in claim 1, wherein said power detecting means comprises:
   voltage detecting means for generating a voltage detecting signal by detecting the output voltage of said solar cell;
   current detecting means for generating a current detecting signal by detecting the output current of said solar cell; and
   a multiplier for generating said power detecting signal by multiplying said voltage detecting signal by said current detecting signal.

3. A maximum power point detecting circuit comprising:
   power detecting means for generating a power detecting signal responsive to an output voltage and an output current of a solar cell;
   signal generating means for generating a sampling signal; and
   maximum power point discriminating means for comparing a previous quantity of charge with a current quantity of charge charged according to said power detecting signal for a given time in response to said sampling signal, and judging that an output power of said solar cell decreases when said previous quantity of charge is greater than said current quantity of charge to generate a discriminating signal; and
   wherein said sampling signal of said signal generating means comprises:
      a first switching signal with a "high" interval longer than a "low" interval during one period,
      a second switching signal shifted by the "high" interval of said first switching signal,
      a clock signal having the same period as said first and second switching signals and having the "high" interval of one period only at an interval in which the "high" intervals of said first and second switching signals are overlapped, and
      a set signal having the same period as said first and second switching signals and having a rising edge at a falling edge of said clock signal.

4. A maximum power point detecting circuit as claimed in claim 3, wherein said maximum power point discriminating means comprises:
   a comparator;
   a first current source connected between an inverting terminal of said comparator and a ground terminal, said first current source varying in its output current in response to said power detecting signal;
   a second current source connected between a noninverting terminal of said comparator and the ground terminal, said second current source varying in its output current in response to the power detecting signal and having the same quantity of current as said first current source;
   a capacitor connected between the inverting and noninverting terminals of said comparator;
   a first switch connected between the inverting terminal of said comparator and a reference voltage, said first switch being turned on by the "high" interval of said first switching signal, and turned off by the "low" interval of said first switching signal;
   a second switch connected between the noninverting terminal of said comparator and the reference voltage, said second switch being turned on by the "high" interval of said second switching signal, and turned off by the "low" interval of said second switching signal; and
   a flip-flop for latching the output of said comparator in response to said clock signal, and setting an output in response to said set signal.

5. A maximum power point detecting circuit comprising:
   power detecting means for generating a power detecting signal responsive to an output voltage and an output current of a solar cell;
   comparing means for comparing a previous power average value with a current power average value according to said power detecting signal for a constant time; and
   discriminating means for latching an output signal of said comparing means immediately after a current constant time, setting an output immediately before a previous constant time, and judging that an output power of said solar cell decreases when said current power average value is smaller than said previous power average value to generate a discriminating signal.

6. A method for determining a maximum power point comprising the steps:
   generating a power detecting signal responsive to an output voltage and an output current of a solar cell;
   integrating the power detecting signal over a first sample period to obtain a first sample voltage;
   integrating the power detecting signal over a second sample period to obtain a second sample voltage; and
   comparing the first and second sample voltages in order to generate a discriminating signal.

* * * * *